(12) United States Patent
Isaacs et al.

(10) Patent No.: US 11,075,527 B2
(45) Date of Patent: Jul. 27, 2021

(54) PORTABLE DUAL-DEVICE CHARGER SYSTEM

(71) Applicant: GOOGLE LLC, Mountain View, CA (US)

(72) Inventors: Philip Michael Isaacs, Kitchener (CA); Kai Xu, Mississauga (CA); David Vandervies, Waterloo (CA)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/573,483

(22) Filed: Sep. 17, 2019

(65) Prior Publication Data

US 2020/0091740 A1  Mar. 19, 2020

Related U.S. Application Data

(60) Provisional application No. 62/733,243, filed on Sep. 19, 2018.

(51) Int. Cl.
*H02J 7/00* (2006.01)
*H03K 5/24* (2006.01)
*H02M 3/155* (2006.01)

(52) U.S. Cl.
CPC .......... *H02J 7/0026* (2013.01); *H02J 7/0072* (2013.01); *H02M 3/155* (2013.01); *H03K 5/24* (2013.01)

(58) Field of Classification Search
CPC ...... H02J 7/00; H02J 7/02; H02J 7/025; H02J 7/0026; H02J 7/0072; H02J 7/0052; H02J 7/0047; H02J 7/0029; H02J 7/0036; H02J 7/0054; G06F 1/263; H02M 3/155; H02M 3/157; H03K 5/24
USPC .............................. 307/19, 17, 22, 21, 23–96
See application file for complete search history.

(56) References Cited

U.S. PATENT DOCUMENTS

| 6,178,514 | B1 | 1/2001 | Wood | |
|---|---|---|---|---|
| 7,679,317 | B2 | 3/2010 | Veselic | |
| 9,450,432 | B1 * | 9/2016 | Burns | H02J 7/342 |
| 9,859,725 | B2 * | 1/2018 | Nowak | H02J 7/0047 |
| 2008/0062600 | A1 | 3/2008 | Crawley et al. | |
| 2009/0027068 | A1 * | 1/2009 | Philipp | G08B 13/08 324/678 |
| 2009/0184687 | A1 * | 7/2009 | Schroeder | H02J 7/0071 320/162 |
| 2011/0248669 | A1 * | 10/2011 | Cunanan | H02J 7/0063 320/106 |
| 2016/0204632 | A1 * | 7/2016 | Kleine | H02J 7/0068 320/134 |
| 2018/0233934 | A1 | 8/2018 | Miller et al. | |
| 2019/0157899 | A1 * | 5/2019 | Bailey | H01M 10/465 |
| 2020/0006952 | A1 * | 1/2020 | Jang | G06F 1/266 |
| 2020/0144839 | A1 * | 5/2020 | De Vos | H02J 7/0024 |

* cited by examiner

*Primary Examiner* — Rexford N Barnie
*Assistant Examiner* — Jagdeep S Dhillon

(57) ABSTRACT

A portable charger system provides two charger ports with different charging characteristics. Two devices having different charging characteristics may be coupled to the two charger ports to be charged simultaneously.

21 Claims, 9 Drawing Sheets

PORTABLE DUAL-DEVICE CHARGER SYSTEM

CROSS-REFERENCE TO RELATED APPLICATIONS

This application claims the benefit of U.S. Provisional Application No. 62/733,243, filed 19 Sep. 2018, titled "Portable Dual-Device Charger System", the content of which is incorporated herein in its entirety by reference.

TECHNICAL FIELD

The disclosure relates generally to portable chargers and more specifically to a portable charger capable of charging two electronic devices with different charging requirements.

BACKGROUND

There is a new generation of wearable heads-up displays that can be worn on the head like conventional eyeglasses. To interact with content on the wearable heads-up display, a portable UI device that communicates wirelessly may be used. Both the wearable heads-up display and portable UI device have storage batteries or supercapacitors that need to be periodically recharged. These devices typically have different storage capacities and may have different charging requirements, which generally means that the user will need to carry around two different chargers.

SUMMARY

A portable charger system for charging a first device and a second device may be summarized as including a first charger port to provide an electrical connection with a first device, a second charger port to provide an electrical connection with a second device, a constant voltage source having an output coupled to the first charger port, a constant current source having an output coupled to the second charger port, a rechargeable battery, a connector having a connector input node to receive input power from an external source and a connector output node, a battery charger having a battery charger input node coupled to the connector output node, a battery charger output node coupled to the constant voltage source and the constant current source, and a battery node coupled to the rechargeable battery, the battery charger having a power path management control circuit that forms (i) a first device charging path between the battery charger input node and the battery charger output node when a voltage on the battery charger input node is above a select voltage threshold, (ii) a battery charging path between the battery charger input node and the battery node when the voltage on the battery charger input node is above the select voltage threshold, and (iii) a second device charging path between the battery node and the battery charger output node when the voltage at the battery charger input node is at or below the select voltage threshold.

The connector may be a USB connector.

The portable charger may further include a common node filter in an electrical path between the connector output node and the battery charger input node, the common mode filter having characteristics to remove electromagnetic interference from one or more USB data lines. The common mode filter may further have characteristics to suppress electrostatic discharge in the electrical path. The portable charger system may further include a processor coupled to a node of the common mode filter to receive a ship mode detection signal and coupled to the battery charger to activate the battery charger in response to receiving the ship mode detection signal.

The constant voltage source may be a DC-DC converter. The constant voltage source may output a voltage of approximately +5 V.

The portable charger system may include an overcurrent protection at an output of the constant voltage source. The portable charger system may further include a processor coupled to the overcurrent protection to provide an enable control signal to the overcurrent protection.

An input of the constant current source may be coupled to the output of the constant voltage source. The portable charger system may further include a switch at the input of the constant current source to enable or disable power supply from the constant voltage source to the constant current source. The switch may be a high side switch including a P-channel MOSFET coupled to an N-channel MOSFET.

The portable charger system may further include a temperature limit comparator circuit including a temperature limit comparator having a first input node coupled to a thermistor circuit that provides a thermistor signal, a second input node coupled to a temperature limit threshold circuit that provides a temperature limit threshold signal, and an output node to output a temperature limit comparator signal representative of a comparison between the thermistor signal and the temperature limit threshold signal, where the output node is coupled to the switch to provide an enable port of the switch with the temperature limit comparator signal. The portable charger system may include a processor coupled to the output node of the temperature limit comparator, the processor to detect the temperature limit comparator signal and selectively adjust the temperature limit comparator signal. The thermistor circuit may include a thermistor to sense a temperature in the system. The portable charger system may include a printed circuit board carrying at least the constant voltage source, the constant current source, and the battery charger, where the thermistor senses a temperature of the printed circuit board.

The portable charger system may include a plurality of light emitting diodes, a light emitting diode driver coupled to the light emitting diodes to provide a drive control to each of the light emitting diodes, and a processor communicatively coupled to the light emitting diode driver, the processor to provide a charging state of at least one of the first device, the second device, and the rechargeable battery to the light emitting diode driver. The portable charger system may include a first device charging monitor circuit to sense a charging current of the first device through the first charger port and generate an output representative of the charging state of the first device, where the processor is communicatively coupled to the first device charging monitor circuit to receive the output representative of the charging state of the first device. The portable charger system may include a second device charging monitor circuit coupled to sense a charging current of the second device through the second charger port and generate an output representative of the charging state of the second device, where the processor is communicatively coupled to the second device charging monitor circuit to receive the output representative of the charging state of the first device. The portable charger system may further include a battery voltage monitor circuit coupled to sense changes in a voltage of the rechargeable battery. The battery voltage monitor circuit may include a battery voltage comparator having a first input node coupled to the battery node, a second input node coupled to receive a battery voltage threshold signal, and an output node to output a battery voltage comparator signal representative of a comparison between a voltage signal received on the first input node and the battery voltage threshold signal, where the processor is communicatively coupled to the battery voltage monitor circuit to receive the battery voltage comparator signal. The portable charger system may further include a charging current flag circuit including a charging current flag op-amp having a first input node coupled to an output of one of the first and second device charging monitor circuits to receive a device charging current signal, a second input node coupled to receive a charging current threshold signal, and an output node to output a charging current flag signal indicative of a comparison between the device charging current signal and the charging current threshold signal, where the processor is coupled to the output node to receive the charging current flag signal.

The foregoing general description and the following detailed description are exemplary of the invention and are intended to provide an overview or framework for understanding the nature of the invention as it is claimed. The accompanying drawings are included to provide further understanding of the invention and are incorporated in and constitute part of this specification. The drawings illustrate various embodiments of the invention and together with the description serve to explain the principles and operation of the invention.

BRIEF DESCRIPTION OF DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements and have been solely selected for ease of recognition in the drawing.

DETAILED DESCRIPTION

Figure 1:
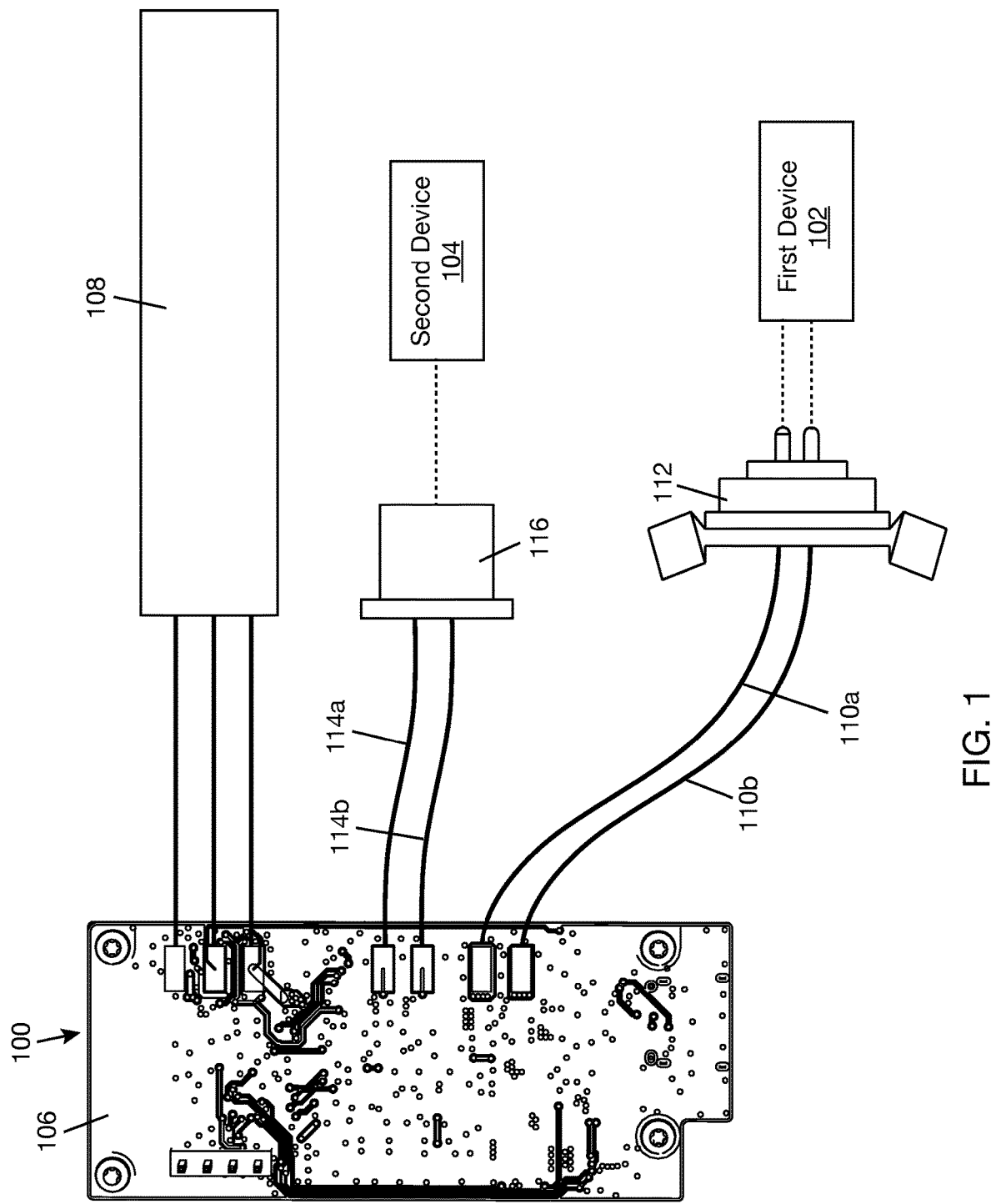
FIG. 1 is a schematic of a portable charger system in communication with two devices according to one illustrative implementation.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices have not been shown or described in detail to avoid unnecessarily obscuring descriptions of the embodiments. For the sake of continuity, and in the interest of conciseness, same or similar reference characters may be used for same or similar objects in multiple figures. For the sake of brevity, the term "corresponding to" may be used to describe correspondence between features of different figures. When a feature in a first figure is described as corresponding to a feature in a second figure, the feature in the first figure is deemed to have the characteristics of the feature in the second figure, and vice versa, unless stated otherwise.

In this disclosure, unless the context requires otherwise, throughout the specification and claims which follow, the word "comprise" and variations thereof, such as, "comprises" and "comprising" are to be construed in an open, inclusive sense, that is as "including, but not limited to."

In this disclosure, reference to "one implementation" or "an implementation" or to "one embodiment" or "an embodiment" means that a particular feature, structures, or characteristics may be combined in any suitable manner in one or more implementations or one or more embodiments.

In this disclosure, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the disclosure provided herein are for convenience only and do not interpret the scope or meaning of the embodiments.

FIG. 1 discloses a portable charger system 100 according to one illustrative implementation. Portable charger system 100 may be used to charge two electronic devices 102, 104 at the same time, or either one of the two devices at any time. In one example, devices 102, 104 may be related (or may be companion devices) in that one of the devices may be used to interact with the other of the devices, generally, wirelessly. In one example, one of the devices 102, 104 may be a wearable display device, e.g., a wearable heads-up display, and the other of the devices 102, 104 may be a wearable UI device. In one example, the wearable display device may be in the form of eyeglasses, and the wearable UI device may be in the form of a ring or loop that can be worn on a finger. In other examples, the wearable UI device may take on other forms, such as wrist band or pendant. Each of devices 102, 104 includes a rechargeable battery, or supercapacitor, for power storage. In one example, devices 102, 104 have different charging requirements. For example, one of devices 102, 104 may require constant voltage charging, while the other of devices 102, 104 may require constant current charging.

Portable charger system 100 may be disposed in a single case, which may also serve as a charging station and storage for the first and second devices. Portable charger system 100 may, in one implementation, include a system on chip (SoC) 106 and a rechargeable battery 108 that is electrically coupled to SoC 106. SoC 106 is an integrated circuit with the necessary electronic circuits and parts for operation of the portable charger (the backside of SoC 106 is visible in FIG. 1). Rechargeable battery 108 may have one or more storage cells. In the example shown in FIG. 1, first device connection wires 110*a*, 110*b* terminating in a port (132 in FIG. 2) may be used to form an electrical connection between charger system 100, or SoC 106, and a first device connector 112. In addition, second device connection wires 114a, 114b terminating in a port (136 in FIG. 2) may be used to form an electrical connection between charger system 100, or SoC 106, and a second device connector 116. Electrical contact between first device 102 and first device connector 112 allows charger system 100 to deliver power to first device 102. Similarly, electrical contact between second device 104 and second device connector 116 allows charger system 100 to deliver power to second device 104.

Figure 2:
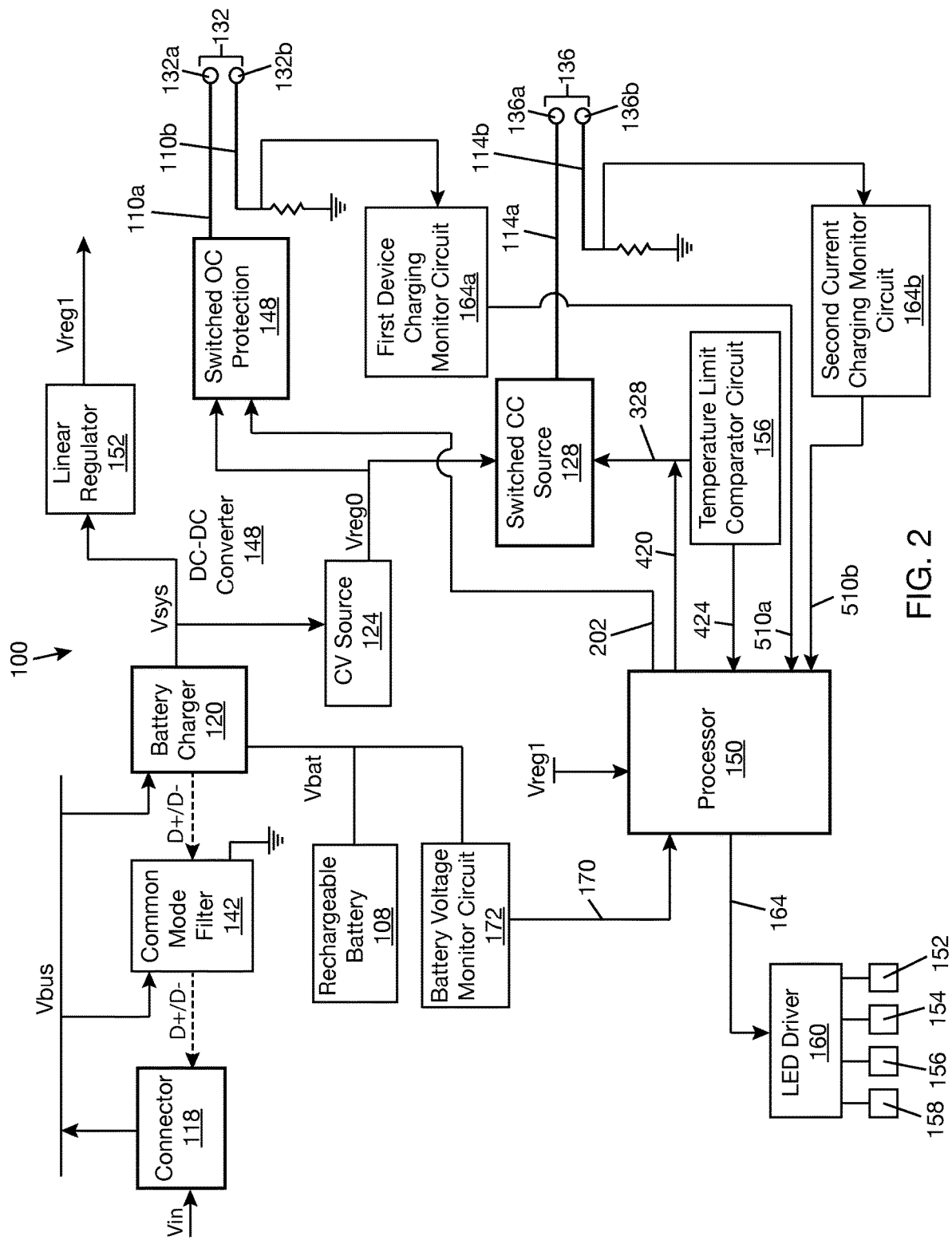
FIG. 2 is a block diagram of the portable charger system of FIG. 1 according to one illustrative implementation.

FIG. 2 is a block diagram of portable charger system 100 according to one illustrative implementation. Charger system 100 may include a connector 118, a battery charger 120, rechargeable battery 108, a constant voltage (CV) source 124, a constant current (CC) source 128, a first charger port 132 (e.g., having terminals or nodes 132a, 132b), a second charger port 136 (e.g., having terminals or nodes 136a, 136b), and a processor 150, e.g., a microcontroller. In one implementation, connector 118 is a USB receptacle connector. In one illustrative example, connector 118 is a USB Type-C™, also known as USB-C™, receptacle connector, as described in Universal Serial Bus Revision 3.2 Specification, or other variations thereof. One suitable example of a USB Type-C™ receptacle connector is available under the trade name 12401610E#2A from Amphenol ICC. A cable (not shown) may be connected to connector 118 to provide input power Vin from an external power source to "Vbus" line. The external power source may be, for example, an AC adapter or a Universal Serial Bus (USB) source. In one implementation, a common mode filter 142 is used to remove electromagnetic interference (EMI) from USB data (D+/D−) lines. The common mode filter 142 may additionally suppress electrostatic discharge (ESD) from Vbus line and USB data (D+/D−) lines. One suitable example of common mode filter with ESD protection is available under the trade name ECMF02-4CMX8 from STMicroelectronics.

Battery charger 120 has an input node that is coupled to Vbus line. In one example, connector 118 delivers +5 V DC power (with a current limit of 1 A in one implementation) to battery charger 120 through Vbus line when connector 118 is connected to an external power source. In one implementation, USB data (D+/D−) lines couple battery charger 120 to common mode filter 142 and ultimately to connector 118. The USB data lines are used to detect if input power Vin is coming from an AC adapter or from a USB host. Battery charger 120 may adjust power demand based on whether input power Vin is coming from an AC adapter or from a USB host. Battery charger 120 further includes a battery node that is coupled to "Vbat" line and an output node that is coupled to "Vsys" line. Rechargeable battery 108 receives and discharges power through Vbat line.

Constant voltage (CV) source 124 receives power from Vsys line. A constant voltage source is a power source that provides a constant voltage to a load regardless of variations or changes in the load resistance. In one example, constant voltage source 124 provides a regulated voltage of +5 V on "Vreg0" line. In one example, constant voltage source 124 is implemented with a DC-DC converter, which may be a boost converter or buck converter depending on whether rechargeable battery 108 has a single cell or multiple cells. From a technical standpoint, the DC-DC converter will be a constant voltage source up to a certain current limit. In the event that the power received from Vsys line is not +5 V, the DC-DC converter will step up or step down the voltage to +5 V. Constant voltage source 124 serves as power supply for the first device and for a switched constant current source 128, which serves as power supply for the second device. A linear regulator 152 also receives power from Vsys line. In one example, linear regulator 152 outputs a regulated voltage of +3.3 V to "Vreg1" line. Devices/circuits requiring +3.3 V, such as processor 150, are coupled to Vreg1 line. It should be understood that the voltages given above are for illustrative purposes.

In one implementation, battery charger 120 includes a power path management control circuit (PPMCC), not shown separately, to form (i) a first device charging path between the input node of battery charger 120 and the output node of battery charger 120, (ii) a battery charging path between the input node of battery charger 120 and the battery node of battery charger 120, and (iii) a second device charging path between the battery node of battery charger 120 and the output node of battery charger 120. When input power Vin is not zero (or when voltage at the input node of battery charger 120 is above a select voltage threshold), power can be provided to constant voltage source 124, and ultimately to switched constant current source 128, through the first device charging path and to rechargeable battery 108 through the battery charging path. PPMCC prioritizes charging of first and second devices through constant voltage source 124 and switched constant current source 128 over charging of rechargeable battery 108. When input power Vin is zero (or when voltage at the input mode of battery charger 120 is at or below the select voltage threshold), power can be provided to constant voltage source 124 and switched constant current source 128 through the second device charging path, i.e., power can be provided to constant voltage source 124 and switched constant current source 128 from rechargeable battery 108. In one example, battery charger 120 with PPMCC may be implemented with a USB battery charger available under the trade name BQ24295 from Texas Instruments Incorporated.

Figure 3:
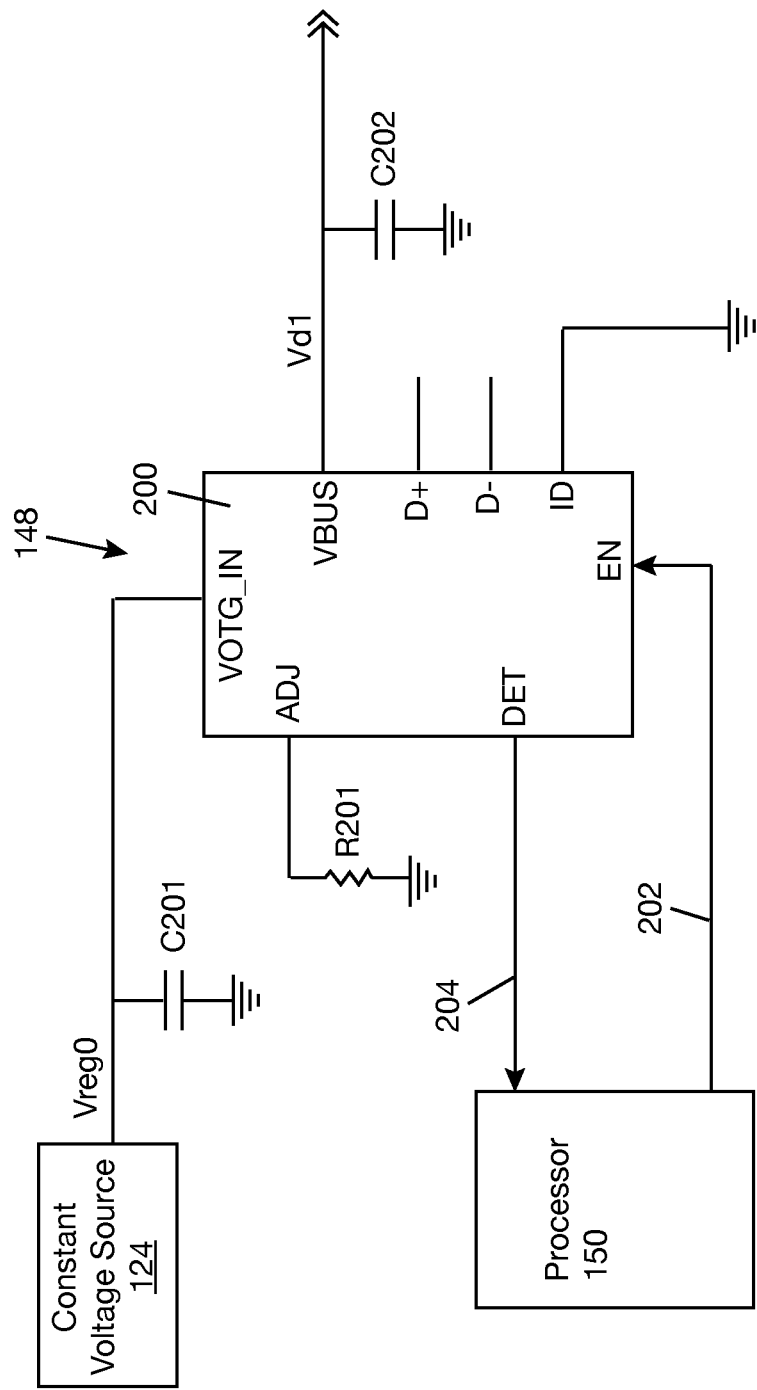
FIG. 3 is a block/circuit diagram of an overcurrent protection applied to an output of a constant voltage source according to one illustrative implementation.

In one implementation, a switched overcurrent (OC) protection 148 is provided at the output of constant voltage source 124 that is coupled to first charger port 132 to allow charging of the first device (102 in FIG. 1). That is, switched overcurrent (OC) protection 148 receives power from Vreg0 line and outputs power to first charger port 132, e.g., through line 110a. Switched overcurrent protection 148 limits the amount of power that would be supplied to first charger port 132 in the event that the output is shorted. "Switched" as used with overcurrent protection 148 generally means that the overcurrent protection can be enabled or disabled, e.g., by processor 150. For illustration purposes, FIG. 3 shows overcurrent protection 148 including a current limiting integrated circuit (IC) 200. In one example, IC 200 is a USB OTG Companion Device available under the trade name TPD4S214 from Texas Instruments Incorporated. OTG stands for "On-the-Go." USB OTG is a specification that allows USB devices to act as a host. USB devices that implement USB OTG can switch back and forth between the roles of host and device. However, current limiting IC 200 is not limited to the TPD4S214 device or USB OTG devices. Other current limiting circuits may be used instead of the TPD4S214 device.

In the example shown in FIG. 3, "VOTG_IN" pin of current limiting IC 200 is coupled to Vreg0 line, which receives power from constant voltage source 124. A line filter capacitor C201 (e.g., 10 µF) is connected across VOTG_IN pin and ground. "VBUS" pin is coupled to "Vd1" line, which feeds the first charger port (132 in FIG. 2), thereby allowing charging of the first device (102 in FIG. 1). A line filter capacitor C202 (e.g., 10 µF) is provided near VBUS pin. TPD4S214 device has an OTG switch (not shown in FIG. 3) that is activated when "EN" pin is high.

After the OTG switch is activated, the voltage level at VBUS pin will be ramped to the voltage level at VOTG_IN pin, allowing current limiting IC 200 to supply power to Vd1 line. Processor 150 (also shown in FIG. 2) can drive EN pin high (or low) via control line 202. Processor 150 may also detect if there is supply voltage in current limiting IC 200 from detection line 204.

Figure 4:
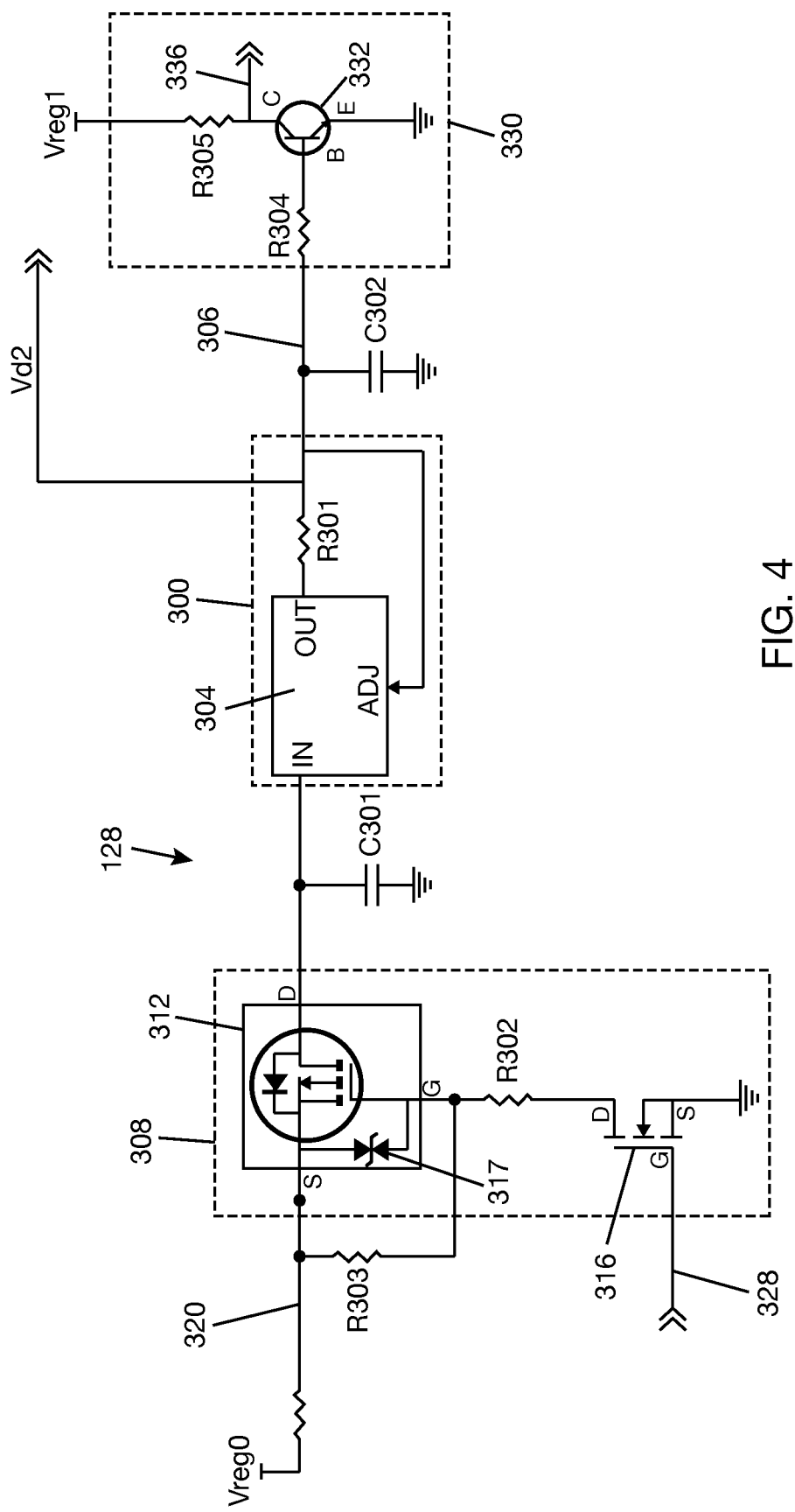
FIG. 4 is a circuit diagram of a switched constant current source according to one illustrative implementation.

Returning to FIG. 2, switched constant current source 128 receives power from Vreg0 line and outputs power to second charger port 136, e.g., via line 114a, allowing charging of the second device (104 in FIG. 1). "Switched" as used with constant current source 128 generally means that the constant current source can be enabled or disabled, e.g., by processor 150 or temperature limit comparator circuit 156. FIG. 4 shows switched constant current source 128 according to one illustrative implementation. In FIG. 4, switched constant current source 128 includes a constant current source 300 that delivers power to "Vd2" line, which can be coupled to the second charger port (136 in FIG. 2). A constant current source is a device/circuit that produces a constant value of current regardless of source voltage or load resistance. A constant current source may be implemented with transistors and resistors. There are also off-the-shelf solutions that can be configured to behave as constant current sources. In one example, constant current source 300 includes a voltage regulator device 304 configured to behave as a constant current source. In one example, voltage regulator device 304 is based on an adjustable, 3-terminal, positive-voltage regulator device available under the trade name LM317L from Texas Instruments Incorporated. The LM317L can be configured to provide constant current by connecting resistor R301 (e.g., 80.6Ω) across "OUT" pin and "ADJ" pin. In one example, the LM317L device is configured as a constant current source that limits the current the loop can take to charge up its internal capacitor. Since the LM317L device has a reference voltage of 1.25 V typically, then with the R301 value of 80.6Ω, the current limit is 15.5 mA approximately. At this level of output current, the dropout voltage should be around 1.5 V. Thus, with a 5 V input, the compliance limit for the circuit shown is about 3.5 V. Voltage regulator device 304 receives power through "IN" pin. A capacitor C301 (e.g., 1 µF) is provided near the IN pin. Vd2 line that feeds the second charger port (136 in FIG. 2) is coupled to the output of voltage regulator device 304, or output of constant current source 300.

Switched constant current source 128 may include a short circuit detector 330 formed at an output side of constant current source 300. In one example, short circuit detector 330 includes a transistor 332 having base "B" coupled to the output of constant current source 300, as shown by line 306, collector "C" coupled to Vreg1 line through resistor R305 (e.g., 200 kΩ), and emitter "E" tied to ground. Line 306 may include a filter capacitor C302 (e.g., 1 µF). Also, a resistor R304 (e.g., 100 kΩ) may limit the amount of power drawn by transistor 332. If for some reason the second device (104 in FIG. 1) is drawing too much current while being charged, collector "C" of transistor 332 will go high as transistor 332 is robbed of base current. A signal from collector C corresponding to overcurrent feeds a digital input of the processor (150 in FIG. 2), as shown by line 336.

Switched constant current source 128 further includes a switch 308 that controls delivery of power to constant current source 300. In one example, switch 308 is a high side P-channel switch including a P-channel MOSFET 312 connected to an N-channel MOSFET 316. In one example, P-channel MOSFET 312 may be a P-channel enhancement mode MOSFET and may include ESD protection 317. A suitable P-channel enhancement mode MOSFET is available under the trade name DMP210DUFB4 from Diodes Incorporated. The source "S" of the P-channel MOSFET 312 is coupled to Vreg0 line (see FIG. 2) by input line 320. The drain "D" of the P-channel MOSFET 312 is coupled to "IN" pin of voltage regulator device 304. A resistor R302 (e.g., 100 kΩ) is connected across the gate "G" of P-channel MOSFET 312 and the drain "D" of N-channel MOSFET 316. A resistor R303 (e.g., 100 kΩ) is connected across gate G of P-channel MOSFET 312 and input line 320. Switch 308 is controlled by a control signal 328, which may come from the processor (150 in FIG. 2) or another circuit in the charging system. When the control signal 328 is high, switch 308 is on, and the second device (104 in FIG. 1) can be charged from the current regulated output of source 300. Switched constant current source 128 is disabled when switch 308 is off.

Returning to FIG. 2, in one implementation, charger system 100 includes a temperature limit comparator circuit 156 that compares a temperature of charger system 100 ("charging system temperature") to a temperature limit threshold and outputs a temperature limit comparator signal that is representative of the comparison. In one example, the charging system temperature is used as a surrogate for the temperature of the second device (104 in FIG. 1), and the temperature limit comparator signal is used to determine whether the second device is in an over-temperature condition or not. This feature may be used when there is no direct access to the temperature of the second device and/or when the second device is too small to allow an onboard charging circuit that automatically shuts off when the second device is deemed to be too hot to continue to be charged. In one implementation, the temperature limit comparator signal is fed to the switch (308 in FIG. 4) of switched constant current source 128. Thus, the temperature limit comparator signal may enable the switched constant current source 128 when the second device is not deemed to be in an over-temperature condition or may disable the switched constant current source 128 when the second device is deemed to be in an over-temperature condition.

Figure 5:
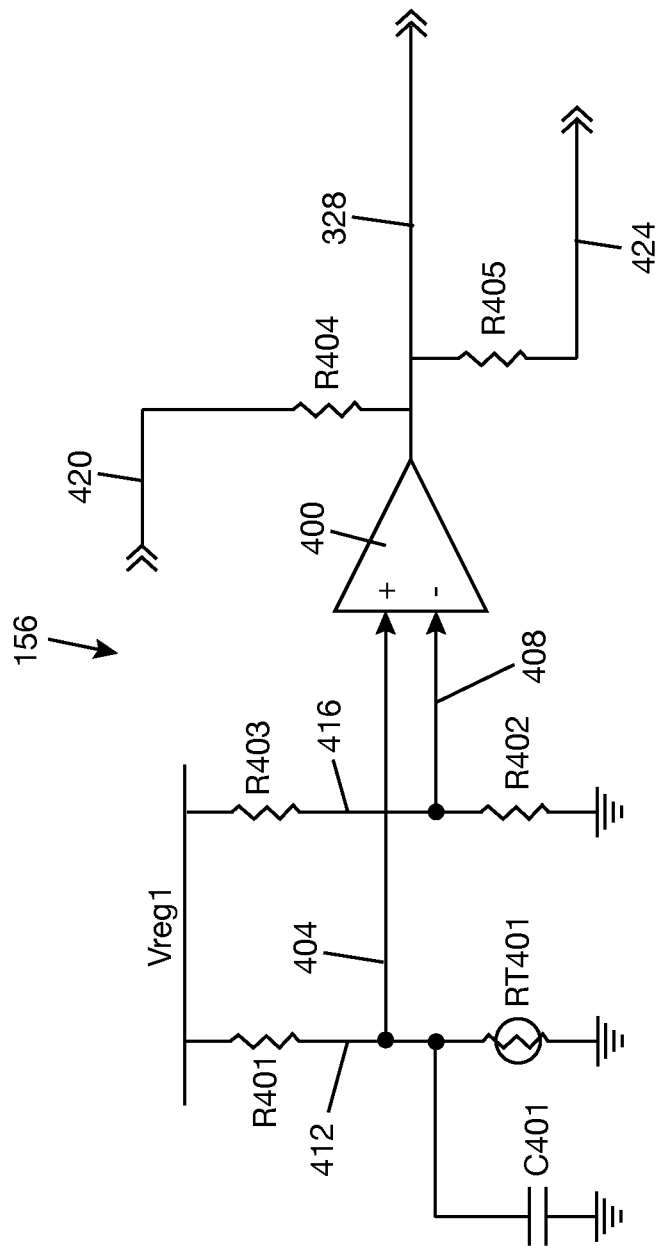
FIG. 5 is a diagram of a temperature limit comparator circuit according to one illustrative implementation.

FIG. 5 shows temperature limit comparator circuit 156 according to one implementation. In the illustrated example, temperature limit comparator circuit 156 includes a temperature limit comparator 400 that receives a thermistor signal 404 on the non-inverting input and a temperature limit threshold signal 408 on the inverting input. A suitable comparator is available under the trade name LMV339 from Texas Instruments Incorporated. Thermistor signal 404 is an output of a thermistor circuit, which is a voltage divider 412 including thermistor RT401 (e.g., 100 kΩ) and resistor R401 (e.g., 200 kΩ) connected in series between Vreg0 line (see FIG. 2) and ground. A capacitor C401 (e.g., 100 nF) is added to the voltage divider 412 to compensate load capacitance. The resistance of thermistor RT401 depends on temperature. Therefore, thermistor signal 404 will vary as the resistance of thermistor RT401 varies. In one example, thermistor RT401 is a negative temperature coefficient (NTC) thermistor, which means that the resistance of thermistor RT401 decreases as temperature increases. In one example, thermistor RT401 is positioned to sense a temperature of the charging system (100 in FIGS. 1 and 2). Any component of the charging system besides the rechargeable battery (108 in FIGS. 1 and 2) may serve as the material whose temperature is sensed by thermistor RT401. (A separate thermistor is provided for the rechargeable battery that feeds control of the temperature window of the battery charger (120 in FIG. 2).) In one example, the charging system includes a printed circuit board (e.g., the board that is part of SoC 106 in FIG. 1), and thermistor RT401 is mounted in contact with the printed circuit board to sense a temperature of the printed circuit board. The temperature limit threshold signal 408 is received from a temperature limit threshold circuit, which is a voltage divider 416 including resistors R402 (e.g., 100 kΩ) and R403 (e.g., 806 kΩ) connected in series between Vreg1 line and ground.

Temperature limit comparator 400 generates temperature limit comparator signal 328 based on a comparison between thermistor signal 404 and temperature limit threshold signal 408. In one implementation, temperature limit comparator signal 328 controls the switch (308 in FIG. 4) of the switched constant current source (128 in FIGS. 2 and 4), e.g., temperature comparator signal 328 may be received at an enable port of the switch (e.g., gate G of MOSFET 316 in FIG. 4). If thermistor signal 404 is lower than temperature limit threshold signal 408, temperature limit comparator signal 328 will be low. If thermistor signal 404 is higher than temperature limit threshold signal 408, temperature limit comparator signal 328 will be high. The constant current source switch (308 in FIG. 4) is turned on when temperature limit comparator signal 328 is high and turned off when temperature limit comparator signal 328 is low. A pull-up resistor R404 (e.g., 100 kΩ) is provided at the output of temperature limit comparator 400. Pull-up resistor R404 is coupled to a digital output 420 of the processor (150 in FIG. 2). Thus, processor 150 can override temperature limit comparator signal 328 generated by temperature limit comparator 400, e.g., by bringing temperature limit comparator signal 328 low in order to turn off the constant current source switch. Resistor R405 (e.g., 100 kΩ) connected to the output of temperature limit comparator 400 feeds a digital input 424 of the processor (150 in FIG. 2). Digital input 424 is simply a digital flag to indicate an over-temperature condition.

Returning to FIG. 2, charger system 100 may include light emitting diodes (LEDs) 152, 154, 156, 158 to provide visual indication of the various states of the charging cycles of the first device (102 in FIG. 1), the second device (104 in FIG. 1), and rechargeable battery 108. In one example, LED 152 is associated with the first device, LED 154 is associated with the second device, and LEDs 156, 158 are associated with rechargeable battery 108. LEDs 152, 154, 156, 158 receive drive controls from LED driver 160, which receives control signal 164 from processor 150. LED driver may be a four-channel LED driver such as available under the trade name LP5562 from Texas Instruments Incorporated. In one example, the drive patterns for LEDs 152, 154, and 156 may be FULL ON, OFF, and BREATHING. FULL ON may be used when the corresponding device (or battery) is fully charged, OFF may be used when the corresponding device (or battery) is not charging, and BREATHING may be used when the corresponding device (or battery) is being charged. The drive pattern for LED 158 may be ON and OFF. ON may be used when the battery voltage is low, and OFF may be used otherwise. In general, LED 158 may have different characteristics compared to LED 156 so that visual indicators provided by LED 158 may be distinguished from visual indicators provided by LED 156. In one example, LEDs 152, 154, 156 are white LEDs, and LED 158 is an amber LED.

To provide control signal 164 to LED driver 160, processor 150 needs to be aware of the different charging states of the first device (102 in FIG. 1), the second device (104 in FIG. 1), and rechargeable battery 108. In one example, charger system 100 relies on sensing the charging currents of first device and second device and inferring the charging states of first device and second device from the charging currents to provide controls for the LEDs 152, 154, 156, 158. In one implementation, charger system 100 includes a first device charging monitor circuit 164a that senses a charging current of first device and outputs a signal that is representative of a charging state of the first device. Charger system 100 also includes a second device charging monitor circuit 164b that senses a charging current of the second device and outputs a signal that is representative of a charging state of the second device. For monitoring the charging states of rechargeable battery 108, charger system 100 includes a battery voltage monitor circuit 172.

The structure of the first device charging circuit 164a and second device charging circuit 164b can be the same. In the interest of conciseness, a common device charging circuit will be described with reference to FIG. 6. However, it should be understood that the structure described in FIG. 6 applies equally to first device charging circuit 164a and second device charging circuit 164b. Resistances and capacitances mentioned in connection with description of the structure in FIG. 6 are for illustration purposes and may be adjusted based on whether the structure is being used in the first device charging circuit or in the second device charging circuit.

Figure 6:
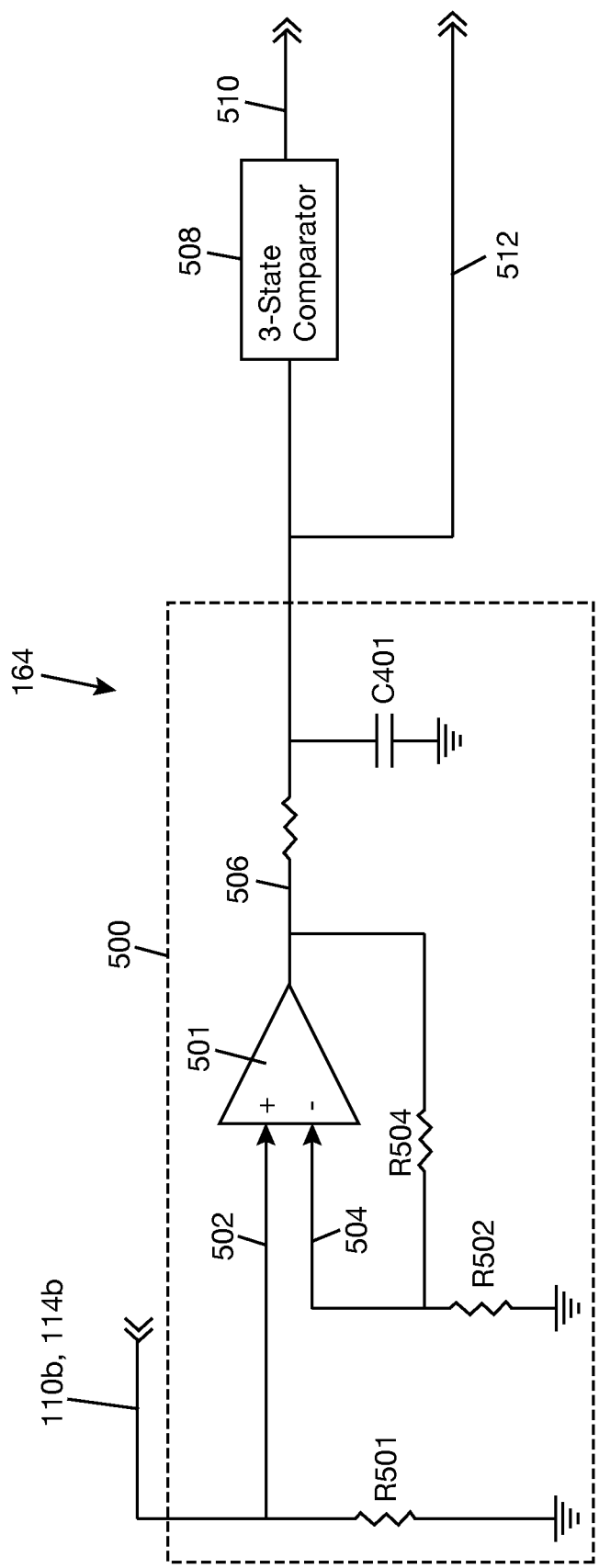
FIG. 6 is a diagram of a device charging monitor circuit according to one illustrative implementation.

FIG. 6 shows an example implementation of a device charging monitor circuit 164 that can serve as either of the first device charging circuit (164a in FIG. 2) and second device charging circuit (164b in FIG. 2). Device charging monitor 164 includes a current sense circuit 500 having a current sense resistor R501 (e.g., 0.1Ω) inserted between negative line of a device (e.g., line 110b for first device or line 114b for second device in FIG. 2) and ground to sense the charging current of the device. Current passing through R501 is fed to the non-inverting input of current sensing op-amp 501, as shown at 502. Op-amp 501 may be, for example, a chopper-stabilized, low-drift op-amp. Resistor R502 (e.g., 1 kΩ) is connected across the inverting input of op-amp 501 and ground, as shown at 504. R504 (e.g., 270 kΩ) is connected across output line 506 of op-amp 501 and input line 504 to form an output clamp to minimize overload recovery time. In the illustrated example, op-amp 501 acts as a transducer and low pass filter, taking sensed current as input and converting the sensed current to a voltage signal. Output line 506 may be fed to a three-state comparator 508, which generates an output 510 (510a in FIG. 2 for first device or 510b in FIG. 2 for second device) that is fed to a digital input of the processor (150 in FIG. 2) to inform the processor of the charging state of the device. Output 506 of current sense circuit 500 may also be fed to a digital input of the processor, as shown at 512, to allow the processor more latitude in inferring a charging state of the device.

Figure 7:
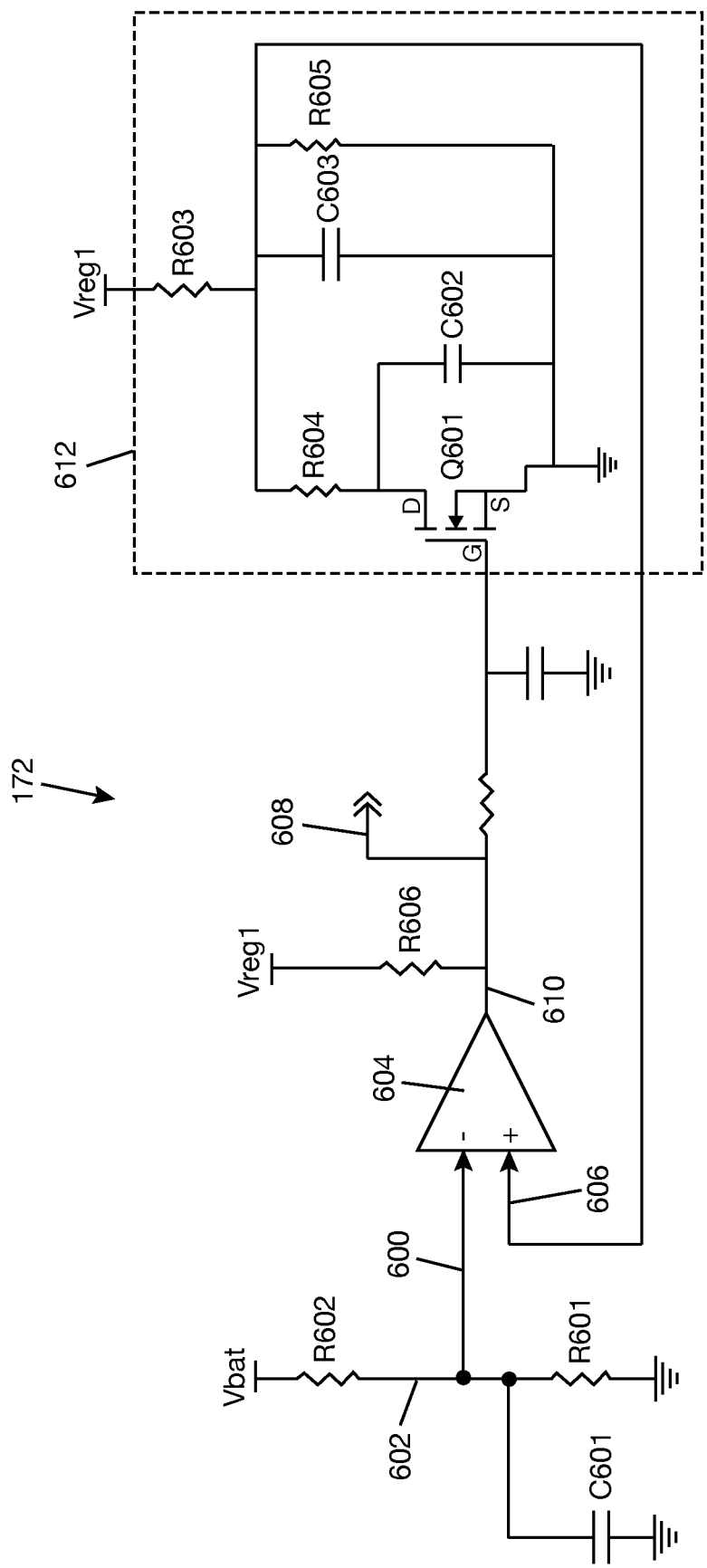
FIG. 7 is a diagram of a battery voltage monitor circuit according to one illustrative implementation.

FIG. 7 is an example implementation of battery voltage monitor circuit 172. An output 600 of a voltage divider 602 including resistor R601 (e.g., 200 kΩ) and resistor R602 (e.g., 620 kΩ) connected in series between Vbat line and ground is fed into an inverting input of a battery voltage comparator 604. Output 600 of voltage divider 602 is a scaled version of Vbat and is therefore a measure of the voltage of the battery (108 in FIG. 2). A capacitor C601 (e.g., 4.7 nF) is added to voltage divider 602 to compensate load capacitance. A battery voltage threshold signal 606 is applied to the non-inverting input of comparator 604. Comparator 604 generates an output 610 that is representative of a comparison between the output 600 of voltage divider 602 and the battery voltage threshold signal 606. Line 608 is a feed of output 610 of battery voltage comparator 604 to the processor (150 in FIG. 2). A pull-up resistor R606 (e.g., 100 kΩ) is provided at an output of battery voltage comparator 604.

Battery voltage threshold signal 606 is provided by a circuit 612 including resistor R603 (e.g., 270 kΩ), resistor R604 (e.g., 806 kΩ), resistor R605 (e.g., 100 kΩ), N-channel MOSFET Q601, and capacitor C602 (e.g., 4.7 nF). Capacitor C603 (e.g., 100 nF) is also a part of the threshold reference voltage circuit 612, but is included just for noise reduction purposes. Battery voltage threshold signal 606 is not constant. In a first case, when Q601 is off, then the threshold reference voltage is provided by the ratio R603 and R605 feeding off Vreg. In a second case, when Q601 is on, then the threshold reference voltage becomes the ratio R603 and R605 in parallel with R604, since drain-source on resistance (RDS(on)) of Q601 is negligible in this case. The third case is the transition of the reference voltage threshold when Q601 changes conduction state from on to off. At the moment Q601 turns off, C602 is shorted (this means that C602 has no effect on the circuit and can be ignored). When Q601 turns on, R604 does not immediately disappear since C602 is still shorted. C602 slowly charges up through R604 and eventually takes R604 out of the reference. Thus, essentially, the reference ramps up at a rate determined by R604 and C602. It should be noted that the reference ramps down rather quickly since RDS(on) of Q601 is quite low. Since Q601 is driven by output 610 of comparator 604, and the level of comparator output 610 depends on the level of voltage divider output 600 and battery voltage threshold signal 606, there will be oscillations in the comparator output 610 when the level of voltage divider output 600 is between the level of comparator output 610 and battery voltage threshold signal 606 until the level of voltage divider output 600 is solidly above, or below, the two reference levels. This is the third comparator state, which is a pulse train.

Figure 8:
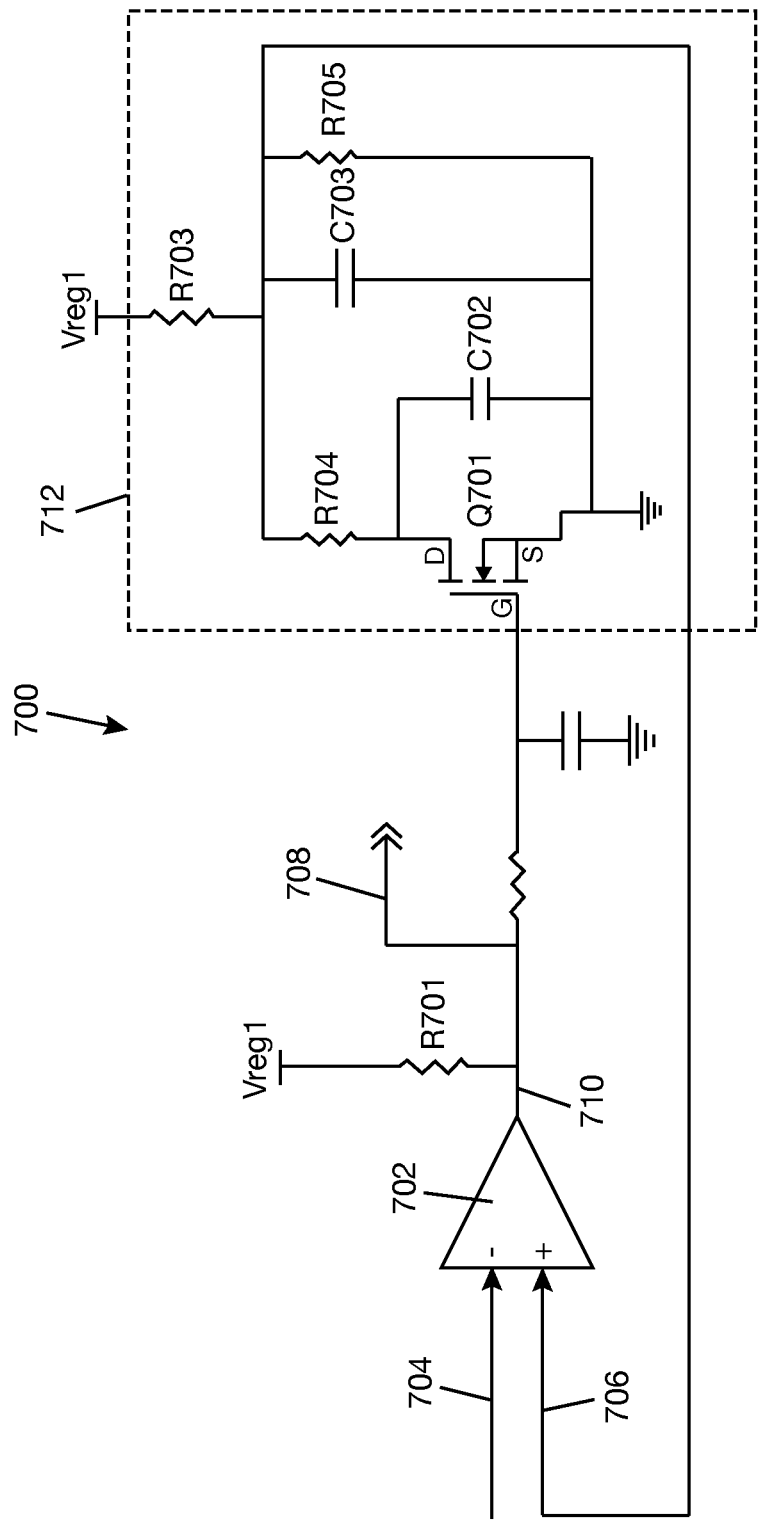
FIG. 8 is a circuit diagram of a digital flag that trips when the charging current of a device drops below a preset value.

In one implementation, for each of the first device (102 in FIG. 1) and the second device (104 in FIG. 1), the charging system (100 in FIGS. 1 and 2) includes a charging current flag circuit that trips when the charging current of the respective device drops below a preset value. FIG. 8 shows an example implementation of a charging current flag circuit 700 for either of the first and second devices (i.e., each of the first and second devices may have an associated charging current flag circuit such as shown in FIG. 8). In FIG. 8, charging current flag comparator 702 receives a device charging current signal 704. For the first device, the device charging current signal 704 is given by the current sense circuit (500 in FIG. 6) of the first device charging monitor circuit (164a in FIG. 2). For the second device, the device charging current signal 704 is given by the current sense circuit (500 in FIG. 6) of the second device charging monitor circuit (164b in FIG. 2). Charging current flag comparator 702 also receives a charging current threshold signal 706 at a non-inverting input. The charging current threshold signal may be a voltage corresponding to the preset value described above. Charging current threshold signal 706 is provided by a circuit 712 including resistor R703 (400 kΩ), resistor R704 (9.1 kΩ), resistor R705 (100 kΩ), N-channel MOSFET Q701, capacitor C702 (e.g., 4.7 nF), and capacitor C703 (e.g., 100 nF). Circuit 712 functions similarly to circuit 612 shown in FIG. 7 and described above. Charging current flag comparator 702 generates an output 710 that is indicative of the comparison between device charging current signal 704 and charging current threshold signal 706. Line 708 is a feed of the output 710 of comparator 702 to the processor (150 in FIG. 2). A pull-resistor R701 is provided at an output of charging current flag comparator 702.

Figure 9:
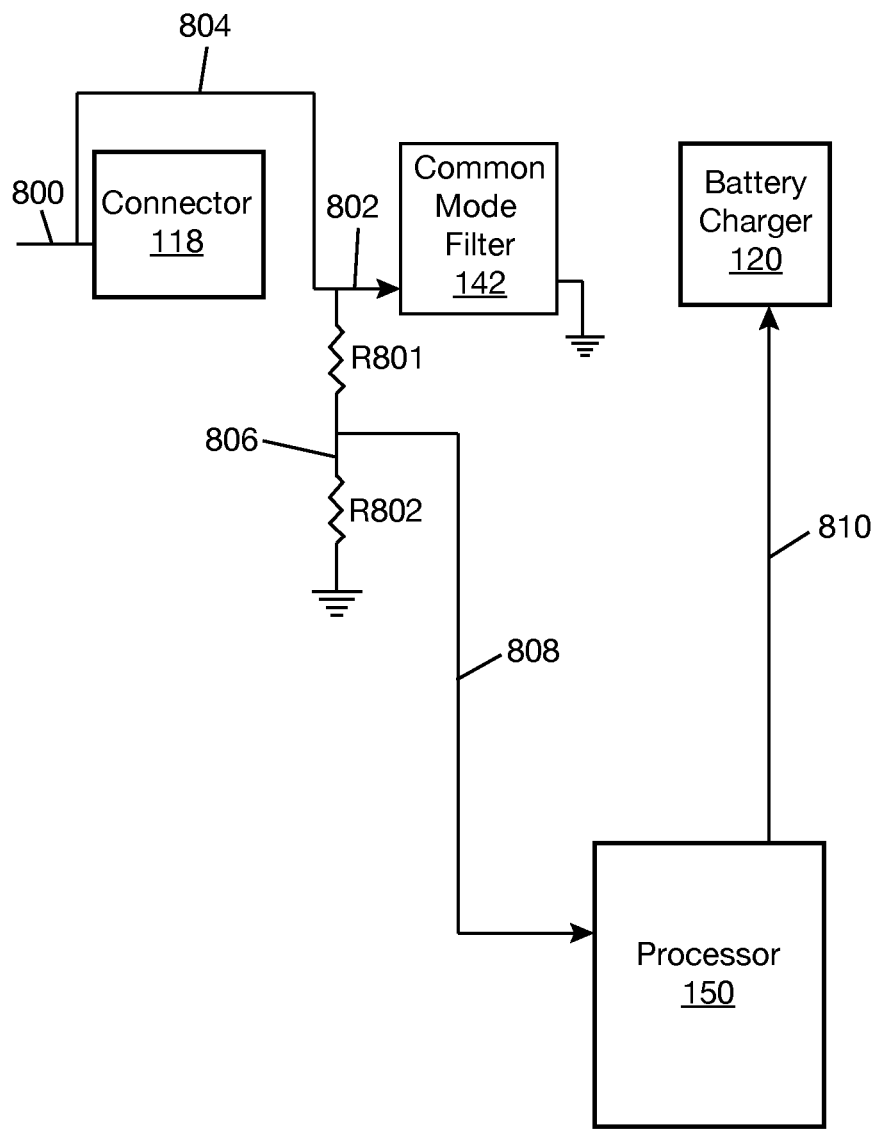
FIG. 9 is a block diagram illustrating a ship mode of the portable charger system of FIG. 2.

Returning to FIG. 2, charger system 100 has a ship mode that can be enabled by processor 150. Ship mode is a state where processor 150 issues a command to battery charger 120 to essentially cut off rechargeable battery 108, thus preventing rechargeable battery 108 from powering anything. In this state, the only battery discharge is due to a small leakage current through the battery charger chip, the consumption of the protection circuit module of the battery, and the battery cell self-discharge. All of these are quite low. This mode is primarily used during shipping, for example, from a point of manufacture to a point of sale. This prevents the battery from being drained during shipping. FIG. 9 shows one of the bus power pins of connector 118, e.g., bus power pin 800, tied to a bus power pin 802 of common mode filter 142, as shown at 804. It should be understood that only the pins of connector 118 and common mode filter 142 needed to describe the ship mode function are shown in FIG. 9. Internally, bus power pin 802 is tied to another pin of common mode filter 142 that is coupled to Vbus line (see FIG. 2). A voltage divider 806 including a series of resistors R801 (e.g., 91 kΩ) and R802 (e.g., 100 kΩ) is connected between the bus power pin 802 of common mode filter 142 and ground. An output voltage 808 of voltage divider 801 feeds a ship mode detector node of processor 150. A "special cable" may be used to connect only bus power pin 800 to ground (the special cable does not connect the remaining bus power pins of connector 118 to ground). Connecting bus power pin 800 to ground means that the output voltage 808 will be low. Processor 150 uses this condition to put the battery charger 120 into ship mode. Processor 150 sends a command to battery charger 120 to go into ship mode, as shown at 810. The special cable may be removed once the battery charger 120 is in ship mode. To remove the battery charger 120 from ship mode, a regular cable is connected to connector 118. This will result in output voltage 808 going high. Processor 150 will sense this high voltage and send a command to battery charger 120 to remove battery charger 120 from ship mode. In one example, voltage divider 806 reduces the voltage fed to processor 150 to +3.3 V, or a voltage level that is usable by processor 150.

The above description of illustrated embodiments, including what is described in the Abstract of the disclosure, is not intended to be exhaustive or to limit the embodiments to the precise forms disclosed. Although specific embodiments and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

The invention claimed is:

1. A portable charger system for charging a first device and a second device, the portable charger system comprising:
 a first charger port to provide an electrical connection with a first device;
 a second charger port to provide an electrical connection with a second device;
 a constant voltage source having an output coupled to the first charger port;
 a constant current source having an output coupled to the second charger port;

a rechargeable battery that is separate from at least the constant voltage source;

a connector having a connector input node to receive input power from an external source and a connector output node, wherein the connector is separate from the first charger port and the second charger port; and a battery charger having a battery charger input node coupled to the connector output node, a battery charger output node coupled to the constant voltage source and the constant current source, and a battery node coupled to the rechargeable battery, the battery charger having a power path management control circuit that forms:

a first device charging path between the battery charger input node and the battery charger output node when a voltage on the battery charger input node is above a select voltage threshold;

a battery charging path between the battery charger input node and the battery node when the voltage on the battery charger input node is above the select voltage threshold; and a second device charging path between the battery node and the battery charger output node when the voltage at the battery charger input node is at or below the select voltage threshold.

2. The portable charger system of claim 1, wherein the connector is a Universal Serial Bus (USB) connector.

3. The portable charger system of claim 2, further comprising a common mode filter in an electrical path between the connector output node and the battery charger input node, the common mode filter having characteristics to remove electromagnetic interference from one or more USB data lines.

4. The portable charger system of claim 3, wherein the common mode filter further has characteristics to suppress electrostatic discharge in the electrical path.

5. A portable charger system for charging a first device and a second device, the portable charger system comprising:

a first charger port to provide an electrical connection with a first device;

a second charger port to provide an electrical connection with a second device;

a constant voltage source having an output coupled to the first charger port;

a constant current source having an output coupled to the second charger port;

a rechargeable battery;

a connector having a connector input node to receive input power from an external source and a connector output node, wherein the connector is a Universal Serial Bus (USB) connector;

a battery charger having a battery charger input node coupled to the connector output node, a battery charger output node coupled to the constant voltage source and the constant current source, and a battery node coupled to the rechargeable battery, the battery charger having a power path management control circuit that forms:

a first device charging path between the battery charger input node and the battery charger output node when a voltage on the battery charger input node is above a select voltage threshold;

a battery charging path between the battery charger input node and the battery node when the voltage on the battery charger input node is above the select voltage threshold; and a second device charging path between the battery node and the battery charger output node when the voltage at the battery charger input node is at or below the select voltage threshold;

a common mode filter in an electrical path between the connector output node and the battery charger input node, the common mode filter having characteristics to remove electromagnetic interference from one or more USB data lines; and a processor coupled to a node of the common mode filter to receive a ship mode detection signal and coupled to the battery charger to activate the battery charger in response to receiving the ship mode detection signal.

6. The portable charger system of claim 1, wherein the constant voltage source is a DC-DC converter.

7. The portable charger system of claim 1, wherein the constant voltage source outputs a voltage of approximately +5 V.

8. The portable charger system of claim 1, further comprising an overcurrent protection at an output of the constant voltage source.

9. The portable charger system of claim 8, further comprising a processor coupled to the overcurrent protection to provide an enable control signal to the overcurrent protection.

10. The portable charger system of claim 1, wherein an input of the constant current source is coupled to the output of the constant voltage source.

11. The portable charger system of claim 10, further comprising a switch at the input of the constant current source to enable or disable power supply from the constant voltage source to the constant current source.

12. The portable charger system of claim 11, wherein the switch is a high side switch comprising a P-channel MOSFET coupled to an N-channel MOSFET.

13. The portable charger system of claim 11, further comprising a temperature limit comparator circuit comprising a temperature limit comparator having a first input node coupled to a thermistor circuit that provides a thermistor signal, a second input node coupled to a temperature limit threshold circuit that provides a temperature limit threshold signal, and an output node to output a temperature limit comparator signal representative of a comparison between the thermistor signal and the temperature limit threshold signal, wherein the output node is coupled to the switch to provide an enable port of the switch with the temperature limit comparator signal.

14. The portable charger system of claim 13, further comprising a processor coupled to the output node of the temperature limit comparator, the processor to detect the temperature limit comparator signal and selectively adjust the temperature limit comparator signal.

15. The portable charger system of claim 13, wherein the thermistor circuit comprises a thermistor to sense a temperature in the system.

16. The portable charger system of claim 15, further comprising a printed circuit board carrying at least the constant voltage source, the constant current source, and the battery charger, wherein the thermistor senses a temperature of the printed circuit board.

17. A portable charger system for charging a first device and a second device, the portable charger system comprising:

a first charger port to provide an electrical connection with a first device;

a second charger port to provide an electrical connection with a second device;

a constant voltage source having an output coupled to the first charger port;

a constant current source having an output coupled to the second charger port;

a rechargeable battery;

a connector having a connector input node to receive input power from an external source and a connector output node;

a battery charger having a battery charger input node coupled to the connector output node, a battery charger output node coupled to the constant voltage source and the constant current source, and a battery node coupled to the rechargeable battery, the battery charger having a power path management control circuit that forms:

a first device charging path between the battery charger input node and the battery charger output node when a voltage on the battery charger input node is above a select voltage threshold;

a battery charging path between the battery charger input node and the battery node when the voltage on the battery charger input node is above the select voltage threshold; and a second device charging path between the battery node and the battery charger output node when the voltage at the battery charger input node is at or below the select voltage threshold;

a plurality of light emitting diodes;

a light emitting diode driver coupled to the light emitting diodes to provide a drive control to each of the light emitting diodes; and a processor communicatively coupled to the light emitting diode driver, the processor to provide a charging state of at least one of the first device, the second device, and the rechargeable battery to the light emitting diode driver.

18. The portable charger system of claim 17, further comprising a first device charging monitor circuit to sense a charging current of the first device through the first charger port and generate an output representative of the charging state of the first device, wherein the processor is communicatively coupled to the first device charging monitor circuit to receive the output representative of the charging state of the first device.

19. The portable charger system of claim 18, further comprising a second device charging monitor circuit coupled to sense a charging current of the second device through the second charger port and generate an output representative of the charging state of the second device, wherein the processor is communicatively coupled to the second device charging monitor circuit to receive the output representative of the charging state of the first device.

20. The portable charger system of claim 19, further comprising a battery voltage monitor circuit coupled to sense changes in a voltage of the rechargeable battery, the battery voltage monitor circuit comprising a battery voltage comparator having a first input node coupled to the battery node, a second input node coupled to receive a battery voltage threshold signal, and an output node to output a battery voltage comparator signal representative of a comparison between a voltage signal received on the first input node and the battery voltage threshold signal, wherein the processor is communicatively coupled to the battery voltage monitor circuit to receive the battery voltage comparator signal.

21. The portable charger system of claim 19, further comprising a charging current flag circuit comprising a charging current flag op-amp having a first input node coupled to an output of one of the first and second device charging monitor circuit to receive a device charging current signal, a second input node coupled to receive a charging current threshold signal, and an output node to output a charging current flag signal indicative of a comparison between the device charging current signal and the charging current threshold signal, wherein the processor is coupled to the output node to receive the charging current flag signal.

\* \* \* \* \*